(12) United States Patent
Nakamura et al.

(10) Patent No.: US 8,427,049 B2
(45) Date of Patent: Apr. 23, 2013

(54) DISPLAY DEVICE

(75) Inventors: Kazuo Nakamura, Kanagawa (JP);
Nobutoshi Asai, Kanagawa (JP);
Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 214 days.

(21) Appl. No.: 12/536,185

(22) Filed: Aug. 5, 2009

(65) Prior Publication Data
US 2010/0033089 A1    Feb. 11, 2010

(30) Foreign Application Priority Data
Aug. 11, 2008    (JP) .................................. 2008-206621

(51) Int. Cl.
*H05B 33/12*    (2006.01)
(52) U.S. Cl.
USPC ............................................ 313/506; 349/61
(58) Field of Classification Search .................. 313/506, 313/502–504; 428/690, 917; 445/23–28; 345/36–37
See application file for complete search history.

(56) References Cited

U.S. PATENT DOCUMENTS
2002/0063515 A1 * 5/2002 Goto ............................ 313/500

FOREIGN PATENT DOCUMENTS
| JP | 2000-195677 | 7/2000 |
| JP | 2005-268024 A | 9/2005 |
| JP | 2007-141646 A | 6/2007 |
| JP | 2007-234572 A | 9/2007 |

OTHER PUBLICATIONS

Japanese Patent Office, Office Action issued in Patent Application JP 2008-206621, on Apr. 27, 2010.

* cited by examiner

*Primary Examiner* — Joseph L Williams
*Assistant Examiner* — Brenitra M Lee
(74) *Attorney, Agent, or Firm* — SNR Denton US LLP

(57) ABSTRACT

A display device includes: a light emitting layer configured to emit light in accordance with current; a first pixel separation film configured to define a first opening for providing a light emitting region when the light emitting layer emits light; and a second pixel separation film laminated on the first pixel separation film and configured to define a second opening that is restricted so as not to gradually become wider as apart from a surface contacted with the first pixel separation film.

7 Claims, 7 Drawing Sheets

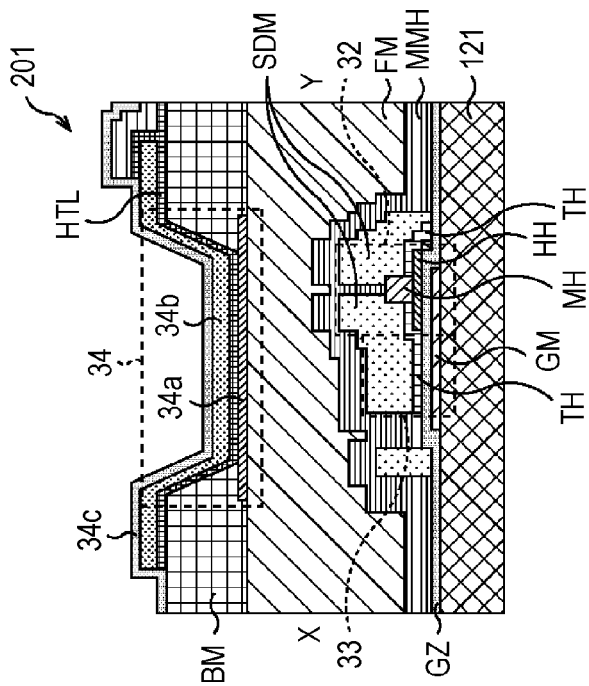
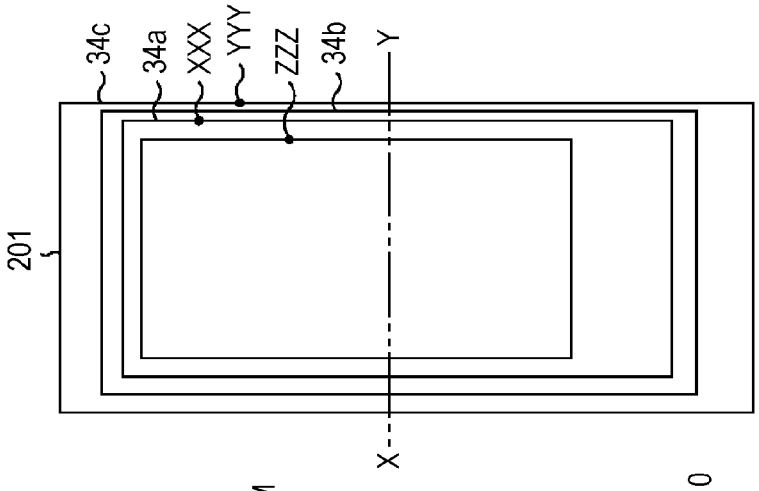
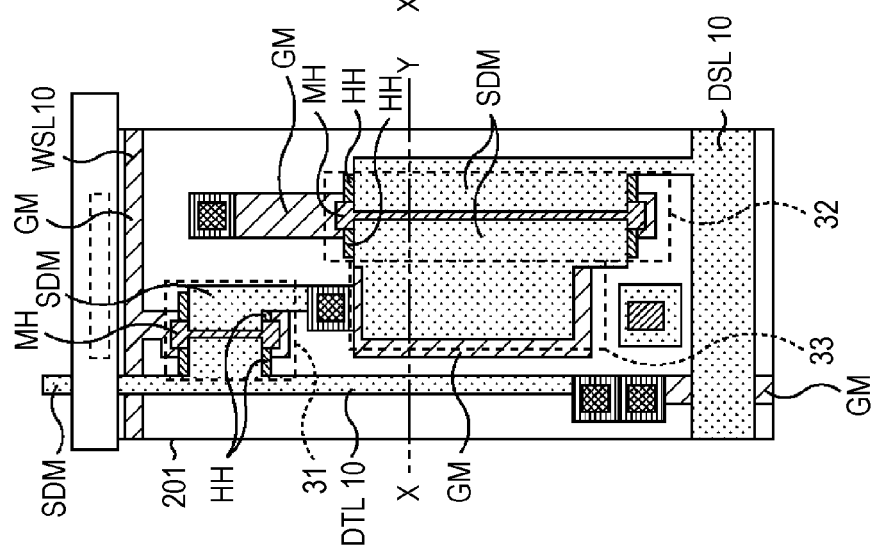

DISPLAY DEVICE

BACKGROUND OF THE INVENTION

1. Field of the Invention

The present invention relates to a display device, and particularly to a display device that can improve display quality.

2. Description of the Related Art

In recent years, as one of flat panel displays (FPD), attention is increasingly focused on an organic EL (electroluminescent) display device using an organic EL element, and the organic EL display devices are being actively developed.

Under the present circumstances, liquid crystal displays (LCD) are the mainstream of flat panel displays. However, because the liquid crystal display is not a device using a self-luminous device and the liquid crystal display needs lighting members such as a backlight and polarizers, the liquid crystal display has problems that the device thickness increases and the brightness is short. In contrast to this, because the organic EL display device is a device using a self-luminous device, the organic EL display device is more advantageous than the liquid crystal display in that the organic EL display device does not need a back light, for example, in principle, the device thickness can be reduced, and high brightness can be obtained.

Particularly, in a so-called active matrix-type organic EL display device formed with TFT circuits for individually switching pixels, each pixel can hold a charge for emission, whereby the power consumption can be suppressed. In addition, the active matrix-type organic EL display device is being actively developed because the active matrix organic EL display device can be relatively easily provided with a large screen and higher definition as well, and the active matrix organic EL display device is expected to be the mainstream of next generation flat panel displays.

In the organic EL display device, in fabricating a pixel array unit in which a plurality of pixels is arranged in a matrix, an anode is deposited, a pixel separation film is formed to individually separate the pixels from each other, an organic film of each of the pixels is then vapor deposited, and a cathode is deposited on it. At this time, the pixel array unit is formed such that the organic films have a multi-layer structure. However, leakage current sometimes occurs between the anode and the cathode through a so-called hole injection layer provided between the anode and the organic film.

In the past, a leakage path that is a channel through which leakage current is carried is varied depending on the deposition order of organic films, and the variation of the leakage paths causes a difference in the flow rate of leakage current. On this account, the current carried through each of the organic films is varied, which causes a color shift to degrade the display quality of the organic EL display device.

For example, JP-A-2000-195677 (Patent Document 1) discloses an organic EL display device in which pixels are separated into a plurality of pixel elements by a pixel separation structure that is a three-dimensional structure having an overhang unit.

SUMMARY OF THE INVENTION

As described above, in the organic EL display device before, the difference in the flow rate of leakage current sometimes causes display quality to be degraded.

Thus, it is desirable to improve display quality.

An embodiment of the invention is directed to a display device including: a light emitting layer configured to emit light in accordance with current; a first pixel separation film configured to define a first opening for providing a light emitting region when the light emitting layer emits light; and a second pixel separation film laminated on the first pixel separation film and configured to define a second opening that is restricted so as not to gradually become wider as apart from a surface contacted with the first pixel separation film.

According to the embodiment of the invention, the first pixel separation film defines the first opening for providing the light emitting region when the light emitting layer emits light in accordance with current, the second pixel separation film is laminated on the first pixel separation film, and the second pixel separation film defines the second opening that is restricted so as not to gradually become wider as apart from a surface contacted with the first pixel separation film.

According to the embodiment of the invention, display quality can be improved.

BRIEF DESCRIPTION OF THE DRAWINGS

FIGS. 3A to 3C are diagrams illustrative of the multilayer structure of a traditional pixel circuit 201;

DESCRIPTION OF THE PREFERRED EMBODIMENTS

Hereinafter, specific embodiments to which an embodiment of the invention is adapted will be described in detail with reference to the drawings.

Figure 1:
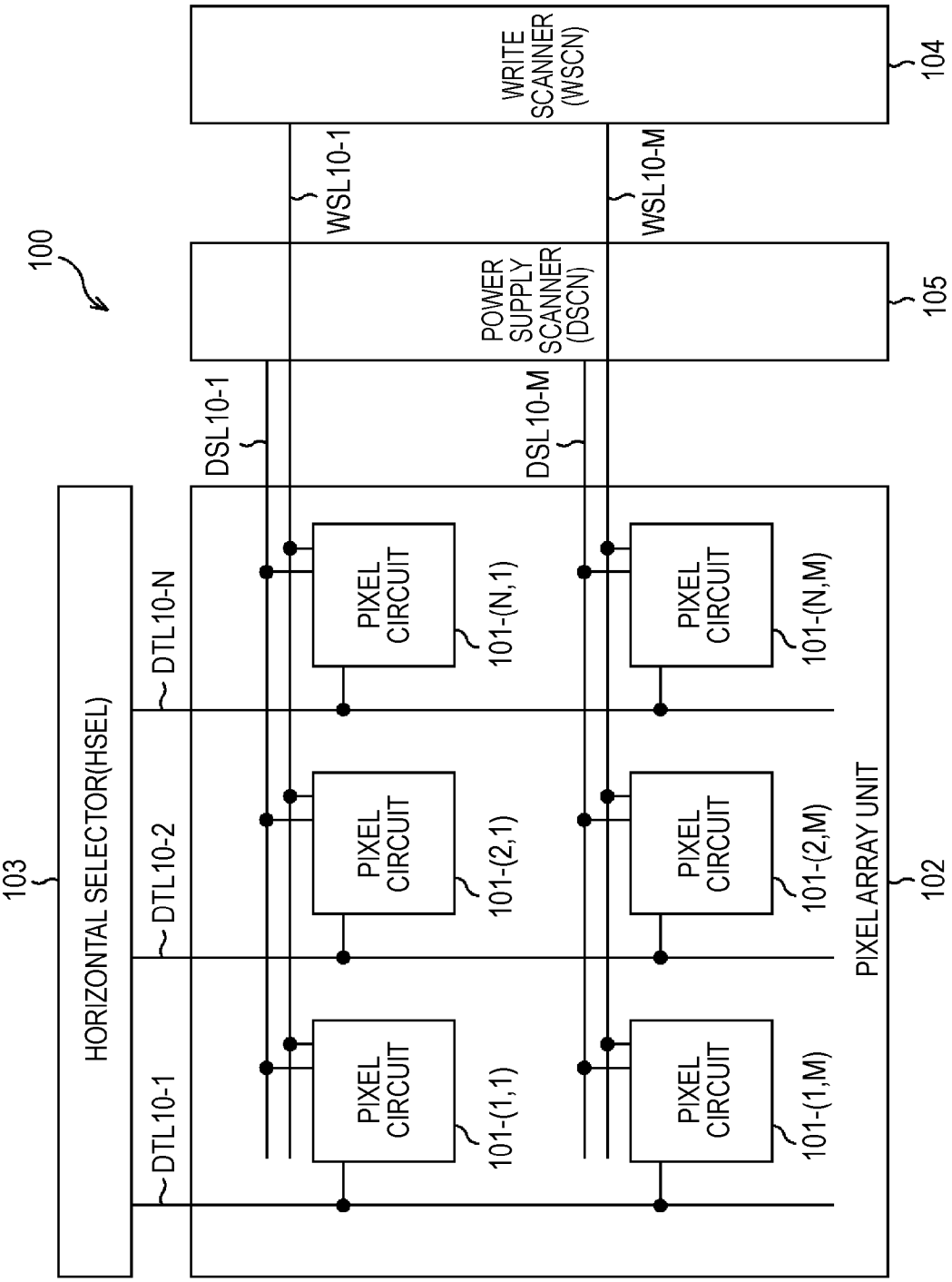
FIG. 1 is a block diagram depicting an exemplary configuration of an embodiment of an organic EL display device to which the invention is adapted.

FIG. 1 is a block diagram depicting an exemplary configuration of an embodiment of an organic EL display device to which the invention is adapted.

An organic EL display device 100 shown in FIG. 1 is configured of a pixel array unit 102 in which N×M pieces of pixel circuits 101-(1,1) to 101-(N,M) are arranged in a matrix, a horizontal selector (HSEL) 103, a write scanner (WSCN) 104, and a power supply scanner (DSCN) 105, which are drive units to drive the pixel circuits.

In addition, the organic EL display device 100 also has M lines of scan lines WSL 10-1 to WSL 10-M, M lines of power supply lines DSL 10-1 to DSL 10-M, and N lines of signal lines DTL 10-1 to DTL 10-N.

In addition, in the descriptions below, when there is no need to individually distinguish among the scan lines WSL 10-1 to WSL 10-M, among the signal lines DTL 10-1 to DTL 10-N, among the pixel circuits 101-(1,1) to 101-(N,M), or among the power supply lines DSL 10-1 to DSL 10-M in particular, they are simply called the scan line WSL 10, the signal line DTL 10, the pixel circuit 101, or the power supply line DSL 10.

Among the pixel circuits 101-(1,1) to 101-(N,M), the pixel circuits 101-(1,1) to 101-(N,1) of the first row are individually connected to the write scanner 104 through the scan line WSL 10-1, and to the power supply scanner 105 through the power supply line DSL 10-1. In addition, among the pixel circuits 101-(1,1) to 101-(N,M), the pixel circuits 101-(1,M) to 101-(N,M) of the Mth row are individually connected to the write scanner 104 through the scan line WSL 10-M, and to the power supply scanner 105 through the power supply line DSL 10-M. Among the pixel circuits 101-(1,1) to 101-(N,M), the other pixel circuits 101 arranged in the column direction are similarly connected.

In addition, among the pixel circuits 101-(1,1) to 101-(N, M), the pixel circuits 101-(1,1) to 101-(1,M) of the first column are connected to the horizontal selector 103 through the signal line DTL 10-1. Among the pixel circuits 101-(1,1) to 101-(N,M), the pixel circuit 101-(N,1) to 101-(N,M) of the Nth column are connected to the horizontal selector 103 through the signal line DTL 10-N. Among the pixel circuits 101-(1,1) to 101-(N, M), the other pixel circuits 101 arranged in the row direction are similarly connected.

The write scanner 104 in turn supplies control signals to the scan lines WSL 10-1 to 10-M for a horizontal period (1H), and sequentially scans the pixel circuits 101 in units of rows. The power supply scanner 105 supplies power supply voltage at a first potential (Vcc) or a second potential (Vss) to the power supply lines DSL 10-1 to 10-M as matched with progressive scan. The horizontal selector 103 switches between the signal potential Vsig to be an image signal and the reference potential Vofs in each horizontal period (1H) as matched with progressive scan, and supplies the potential to the signal lines DTL 10-1 to 10-N in columns.

Figure 2:
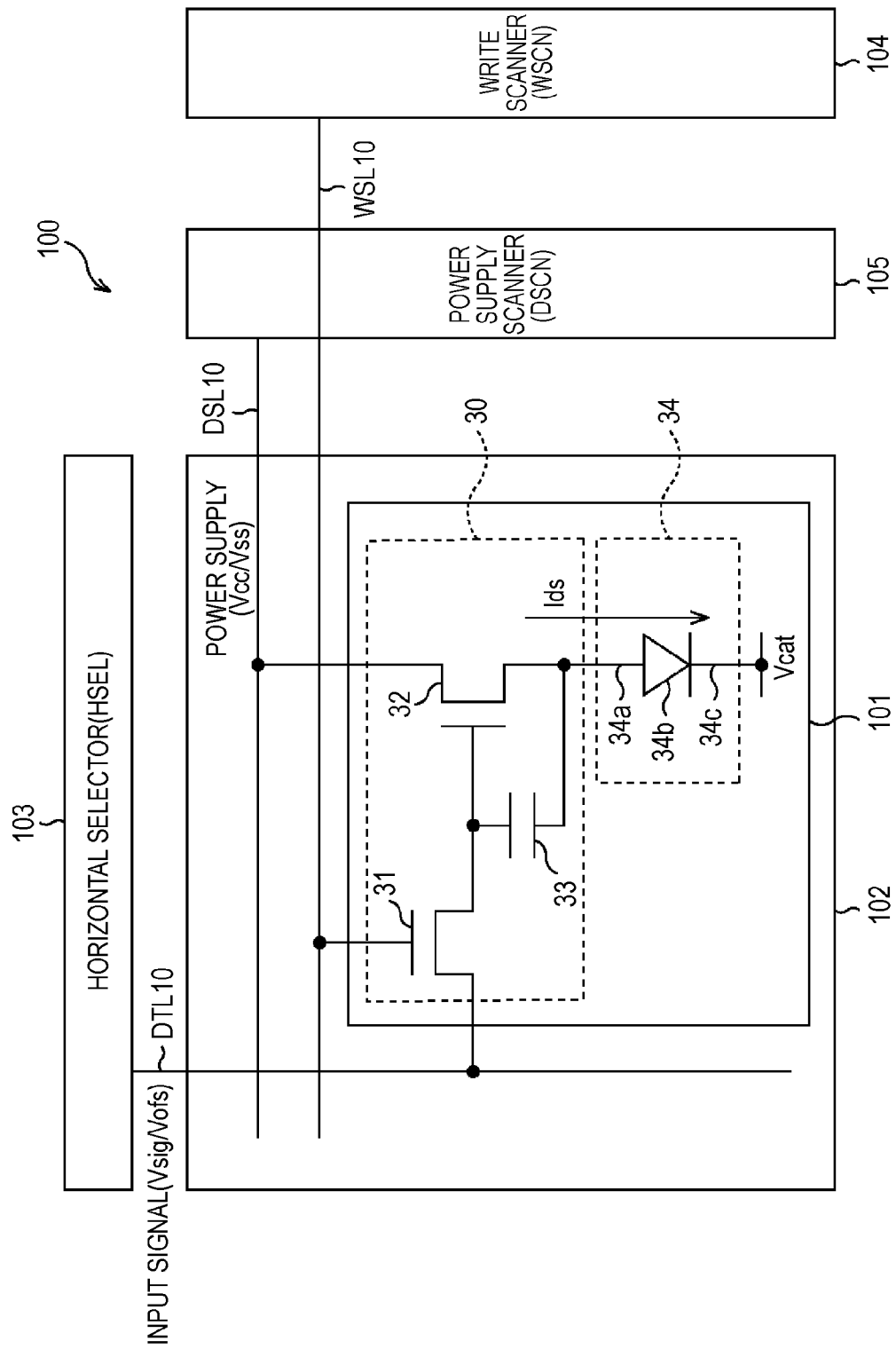
FIG. 2 is a block diagram depicting the detailed configuration of a pixel circuit 101.

FIG. 2 is a block diagram depicting the detailed configuration of the pixel circuit 101 by enlarging a single pixel circuit 101 among N×M pieces of the pixel circuits 101 configuring the pixel array unit 102 shown in FIG. 1.

In addition, as apparent from FIG. 1, the scan line WSL 10, the signal line DTL 10, and the power supply line DSL 10 connected to the pixel circuit 101 in FIG. 2 are the scan line WSL 10-$m$, the signal line DTL 10-$n$, and the power supply line DSL 10-$m$ for the pixel circuit 101-($n,m$) (n=1, 2, to N, and m=1, 2, to M).

The pixel circuit 101 is configured of a TFT circuit 30 and an organic EL element 34. The TFT circuit 30 is configured of a write transistor 31, a drive transistor 32, and a storage capacitor 33. In addition, the device configuration of the TFT circuit 30 is called 2Tr (transistors)+1C (capacitor).

A gate of the write transistor 31 is connected to the scan line WSL 10. A drain of the write transistor 31 is connected to the signal line DTL 10. A source of the write transistor 31 is connected to a gate of the drive transistor 32. A source of the drive transistor 32 is connected to an anode 34$a$ of the organic EL element 34, and a drain of the drive transistor 32 is connected to the power supply line DSL 10. The storage capacitor 33 is connected between the gate of the drive transistor 32 and the anode 34$a$ of the organic EL element 34. In addition, a cathode 34$c$ of the organic EL element 34 is set at a predetermined potential $V_{cat}$.

The organic EL element 34 is a current light emitting element, in which drive current is carried from the anode 34$a$ to the cathode 34$c$ through an organic film 34$b$ that is a light emitting layer (luminous portion), whereby the organic film 34$b$ emits light in gray scale in accordance with the value of the drive current.

In the pixel circuit 101 thus configured, when the write transistor 31 is turned on (conducted) in response to the control signal supplied from the scan line WSL 10, the storage capacitor 33 stores and holds electric charges depending on the signal potential Vsig supplied from the horizontal selector 103 through the signal line DTL 10. The drive transistor 32 is supplied with current from the power supply line DSL 10 at a high potential Vcc, and carries the drive current Ids to the organic EL element 34 depending on electric charges held in the storage capacitor 33, that is, depending on the signal potential Vsig. When a predetermined drive current Ids is carried through the organic EL element 34, the organic EL element 34 emits light.

In other words, the TFT circuit 30 is the drive circuit to drive the organic EL element 34, and supplies the drive current Ids to the organic EL element 34. Then, the organic EL element 34 emits light in the brightness in accordance with the drive current Ids.

However, in fact, because of the structure, the drive current Ids supplied from the TFT circuit 30 to the organic EL element 34 is sometimes leaked to the cathode 34$c$ through a hole injection layer formed between the anode 34$a$ and the organic film 34$b$, not through the organic film 34$b$.

Here, the multilayer structure of a traditional pixel circuit 201 will be described with reference to FIGS. 3A to 3C, and leakage current will be described with reference to FIGS. 4A and 4B.

FIGS. 3A and 3B show exemplary plan layouts of the pixel circuit 101 of FIG. 2. FIG. 3C shows an exemplary sectional layout of the pixel circuit 201.

It is noted that FIG. 3A shows the plan layout depicting only the portion related to a TFT circuit 30 in the pixel circuit 201. It is noted that FIG. 3B shows the plan layout depicting only the portion related to an organic EL element 34 in the pixel circuit 201.

In addition, a user visually sees the pixel circuit 201 in the vertical direction toward the pixel circuit 201, that is, in the direction from the user to the back in FIGS. 3A and 3B, and in the direction from the top to the bottom in FIG. 3C. In addition, in the descriptions below, the upper side in FIG. 3C is referred to as the top side, and the lower side is referred to as the under side.

As shown in FIG. 3A, on a substrate (a substrate 121 shown in FIG. 3C), at least a gate metal GM, a semiconductor film HH, a first inorganic protective film MH, and a source-drain metal SDM are laminated from below in this order.

A gate of a write transistor 31 is formed as a part of the gate metal GM. A source and drain of the write transistor 31 are formed as apart of the source-drain metal SDM. A channel layer of the write transistor 31 is formed as a part of the semiconductor film HH. A gate of a drive transistor 32 is formed as a part of the gate metal GM. A source and drain of the drive transistor 32 are formed as a part of the source-drain metal SDM. A channel layer of the drive transistor 32 is formed as a part of the semiconductor film HH. A lower electrode of a storage capacitor 33 is formed as a part of the gate metal GM. An upper electrode of the storage capacitor 33 is formed as a part of the source-drain metal SDM.

More specifically, as shown in FIG. 3C, on the substrate 121, the gate metal GM, a gate insulating film GZ, the semiconductor film HH, the first inorganic protective film MH, a low resistant semiconductor film TH, and the source-drain metal SDM are laminated from below in this order.

The lower electrode of the storage capacitor 33 is formed as a part of the gate metal GM and the low resistant semiconductor film TH. An insulating film of the storage capacitor 33 is formed as a part of the gate the insulating film GZ. The upper electrode of the storage capacitor 33 is formed as a part of the source-drain metal SDM. The gate of the drive transistor 32 is formed as a part of the gate metal GM. The source and drain of the drive transistor 32 is formed as a part of the source-drain metal SDM. The channel layer of the drive transistor 32 is formed as a part of the semiconductor film HH and the low resistant semiconductor film TH.

In addition, for the semiconductor film HH to be the channel layer of the drive transistor 32, amorphous silicon or microcrystalline silicon is used, for example. For the structure of the drive transistor 32, a so-called inverted staggered structure is adopted. In other words, the gate of the drive transistor 32 is formed on the substrate 121 side. The write transistor 31, not shown, is formed as similar to the drive transistor 32.

After the source-drain metal SDM is laminated, on the substrate 121, a second inorganic protective film MMH and a planarized film FM are laminated from below in this order. The second inorganic protective film MMH is a protective film to protect the TFT circuit 30 against impurities. The top surface of the planarized film FM is smoothed.

After the smoothed film FM is formed, on the substrate 121, an anode 34a, a pixel separation film BM, a hole injection layer HTL, an organic film 34b, and a cathode 34c are laminated from below in this order.

As shown in FIG. 3B, the anode 34a is laminated and formed on the substrate 121 in a rectangular shape surrounded by a frame XXX in the drawing.

The pixel separation film BM is formed in an open rectangular shape in which the area surrounded by a frame ZZZ in the drawing is removed from the area surrounded by a frame YYY on the substrate 121 in the drawing. In other words, a hole is defined by the frame ZZZ in the pixel separation film BM. This hole in the pixel separation film BM is referred to as an opening in the descriptions below, and this opening becomes a light emitting region when the pixel circuit 201 is seen from above. In addition, the pixel separation film BM is formed in an open rectangular shape when attention is focused on a single pixel circuit 201. Because the outer region of the pixel separation film BM (that is, the frame YYY in the drawing) is formed in one piece with the pixel separation film BM of the adjacent pixel circuit 201, when the pixel array unit 102 is seen as a whole, the pixel separation film BM is a film formed with the opening for every corresponding pixel. In addition, the opening of the pixel separation film BM is formed narrower downward.

The hole injection layer HTL is laminated on the anode 34a and on the pixel separation film BM.

The organic film 34b is laminated and formed on the hole injection layer HTL in a wider area than the opening. For the method of forming the organic film 34b, vapor deposition is mainly used when the organic film 34b is a low-molecular organic material, whereas ink jet printing is mainly used when the organic film 34b is a high polymer organic material.

The cathode 34c is laminated and formed on throughout the top surface in a rectangular shape surrounded by the frame YYY in the drawing along the shape of the top surface after the organic film 34b is formed. In addition, because the outer region of the cathode 34c (that is, the frame YYY in the drawing) is formed in one piece with the cathode 34c of the adjacent pixel circuit 201, the cathode 34c is formed almost throughout the entire pixel array unit 102.

The pixel circuit 201 is formed as described above. As discussed above, leakage current is sometimes carried from the anode 34a to the cathode 34c through the hole injection layer HTL, not through the organic film 34b.

The leakage current will be described with reference to FIGS. 4A and 4B.

Figure 4A:
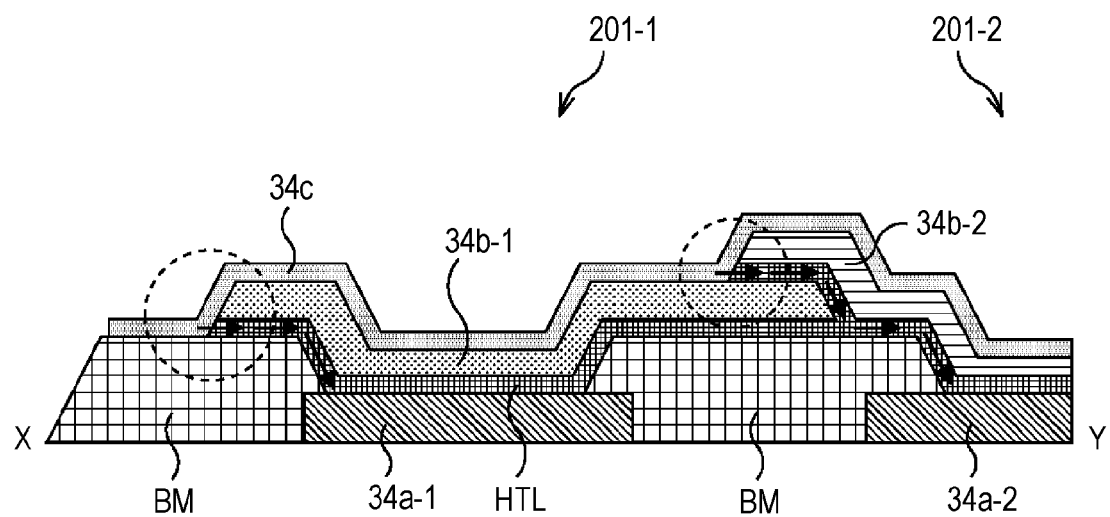
FIGS. 4A and 4B are diagrams illustrative of leakage current.
Figure 4B:
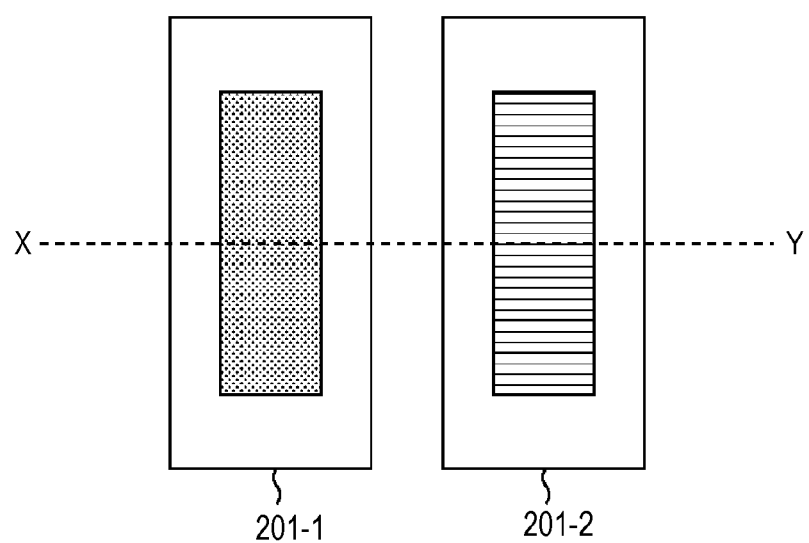

FIGS. 4A and 4B show two pixel circuits 201-1 and 201-2 adjacent to each other. FIG. 4A shows layers laminated above the planarized film FM (FIG. 3C) in an X-Y cross section shown in the plan view of FIG. 4B. In addition, FIG. 4A shows only a portion of the pixel circuit 201-2 contacting with the pixel circuit 201-1.

As shown in FIGS. 4A and 4B, after anodes 34a-1 and 34a-2 are formed on the planarized film FM (FIG. 3C), the pixel separation film BM is formed. In the pixel separation film BM, openings are formed as corresponding to the anodes 34a-1 and 34a-2, and the openings are formed in a tapered shape wider upward.

After that, with a mask for use in vapor depositing an organic film 34b-1, the hole injection layer HTL is formed on the anode 34a-1 and on the area around the opening of the pixel separation film BM, and then the organic film 34b-1 is vapor deposited.

Subsequently, with a mask for use in vapor depositing an organic film 34b-2, the hole injection layer HTL is formed on the anode 34a-2 and on the area around the opening of the pixel separation film BM, and then the organic film 34b-2 is vapor deposited. As shown in FIGS. 4A and 4B, at this time, the hole injection layer HTL and the organic film 34b-2 are formed so as to overlap with the end part of the organic film 34b-1, and the organic films have a multi-layer structure.

Therefore, the hole injection layer HTL is also formed between the organic film 34b-1 and the organic film 34b-2. After that, the cathode 34c is deposited throughout the surfaces of the pixel circuits 201-1 and 201-2.

When the pixel circuits 201-1 and 201-2 are thus formed, both ends of the hole injection layer HTL and the organic film 34b-1 are almost at the same position as well as both ends of the hole injection layer HTL and the organic film 34b-2 are almost at the same position. Therefore, as in the portions depicted by circles of a broken line in FIGS. 4A and 4B, the hole injection layer HTL is contacted with the cathode 34c at the end part of the hole injection layer HTL, and current is carried through the contacted area. In other words, leakage current is carried between the cathode 34c and the anode 34A-1 through the hole injection layer HTL between the pixel separation film BM and the organic film 34b-1, and leakage current is carried between the cathode 34c and the anode 34a-2 through the hole injection layer HTL between the organic film 34b-1 and the organic film 34b-2.

At this time, the length of the hole injection layer HTL between the cathode 34c and the anode 34a-1 is different from the length of the hole injection layer HTL between the cathode 34c and the anode 34a-2, that is, leakage paths are different. In the example shown in FIGS. 4A and 4B, the leakage path between the cathode 34c and the anode 34a-1 is shorter than the leakage path between the cathode 34c and the anode 34a-2. Such difference in the leakage paths depends on the deposition order of organic films. Then, the flow rate of leakage current is varied because of the difference in the leakage paths, and this causes variations in the current carried through the organic film 34b. On this account, a color shift, for example, occurs, and display quality is degraded.

Here, it can be considered that when the leakage path for each of the pixel circuits 201 is the same, the flow rate of leakage current for each pixel will be equal, a color shift will not occur, and then degraded display quality can be avoided.

Then, hereinafter, an exemplary configuration of an embodiment of the pixel circuit to which the invention is adapted will be described.

Figure 5A:
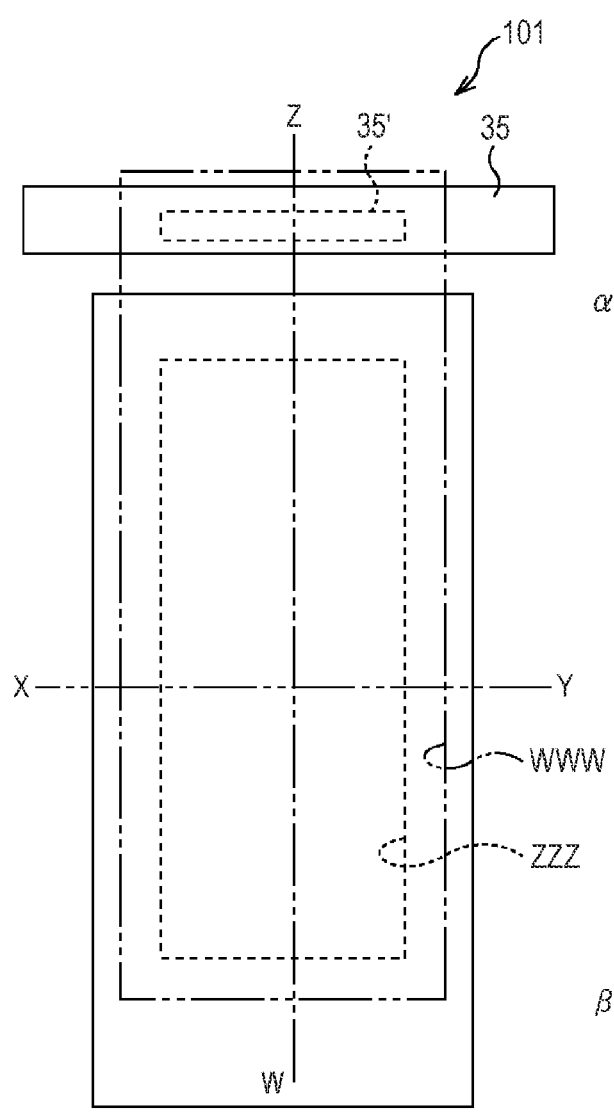
FIGS. 5A to 5C are diagrams depicting an exemplary configuration of an embodiment of the pixel circuit.
Figure 5C:
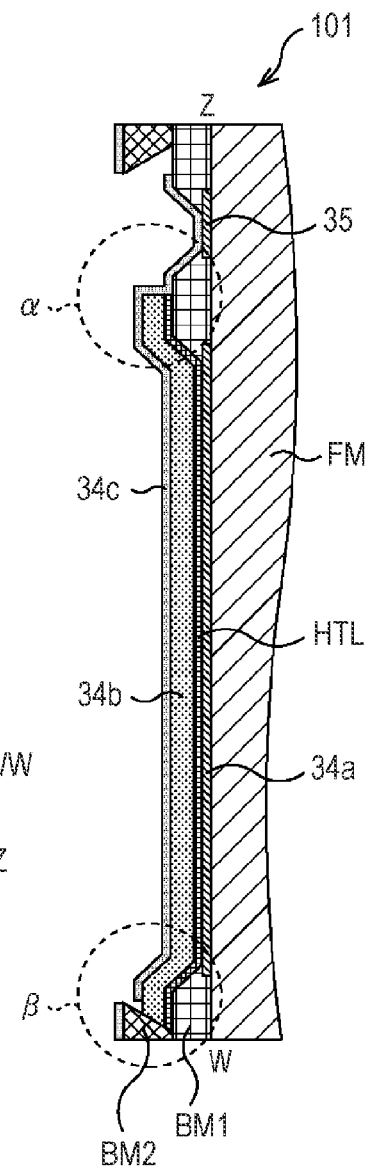
Figure 5B:
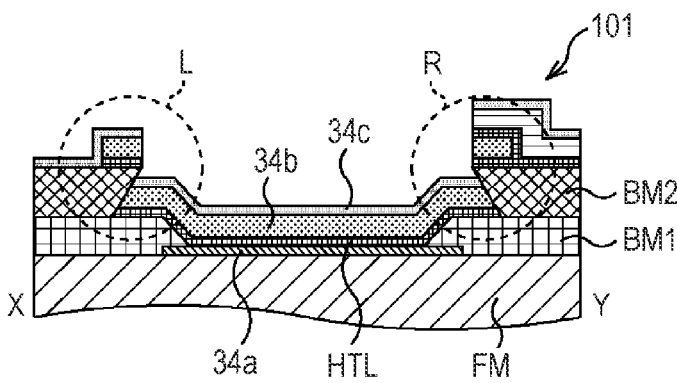

FIG. 5A shows a plan view depicting the pixel circuit 101, FIG. 5B shows an X-Y cross section in FIG. 5A, and FIG. 5C shows a Z-W cross section in FIG. 5A. In addition, in the pixel circuit 101 shown in FIG. 5A to 5C, because the layers below the planarized film FM are configured as similar to those in the pixel circuit 201 shown in FIGS. 3A to 3C, the layers are not shown in the drawings, and the descriptions are omitted.

In the pixel circuit 101, an anode 34a and a cathode wiring (auxiliary wiring) 35 are formed on the planarized film FM, and after that, a first pixel separation film BM1 is formed.

In the first pixel separation film BM1, an opening is formed so as to slightly overlap with the end part of the anode 34a in a tapered shape wider upward. The opening of the first pixel separation film BM1 is the area indicated by a frame ZZZ in FIG. 5A, and this area becomes a light emitting region. In addition, an opening is formed in the first pixel separation film BM1 in a portion overlapped with the cathode wiring 35, and this opening is a cathode contact 35' at which the cathode wiring 35 and a cathode 34c are connected to each other.

Then, on the first pixel separation film BM1, a second pixel separation film BM2 is formed. An opening of the second pixel separation film BM2 is wider than the opening of the first pixel separation film BM1, and is the area indicated by a frame WWW in FIG. 5A. In other words, the opening of the second pixel separation film BM2 is formed so as to include the opening of the first pixel separation film BM1 and the cathode contact 35'. Here, the opening of the second pixel separation film BM2 is formed in a so-called reverse tapered shape narrower upward. In addition, the thickness of the second pixel separation film BM2 is to have the total thickness of a hole injection layer HTL, an organic film 34b, and the cathode 34c, formed later, or above.

After that, the same mask is used to vapor deposit the hole injection layer HTL and the organic film 34b for each color. Here, the mask for use is slightly wider in the X- and Y-directions than the opening of the second pixel separation film BM2. Then, the cathode 34c is vapor deposited throughout the surface of the display area of the pixel array unit 102.

In the pixel circuit 101 thus formed, because the opening of the second pixel separation film BM2 is formed in a reverse tapered shape, the hole injection layer HTL is formed with no contact with the cathode 34c as shown in the areas surrounded by circles L and R of a broken line shown in FIG. 5B. In other words, in forming the hole injection layer HTL and the organic film 34b with the use of the mask wider than the opening of the second pixel separation film BM2, both ends of the hole injection layer HTL and the organic film 34b are partially formed on the second pixel separation film BM2.

Here, for example, when the opening is formed in a tapered shape as that of the first pixel separation film BM1, the hole injection layer HTL and the organic film 34b are formed on the slope of the opening. However, when the opening is formed in a reverse tapered shape as that of the second pixel separation film BM2, neither a layer nor a film is vapor deposited on the slope of the opening. Thus, the hole injection layer HTL can be formed as separated with no contact with the cathode 34c. Therefore, the occurrence of leakage current can be avoided in the lateral direction of FIG. 5B.

In addition, as shown in FIG. 5C, on the opposite side of the second pixel separation film BM2 where the cathode wiring 35 is formed, that is, also in a circle β of a broken line shown in FIG. 5C, the hole injection layer HTL is formed without contact with the cathode 34c. Thus, the occurrence of leakage current can be avoided in the downward direction of FIG. 5C.

On the other hand, in the area of the second pixel separation film BM2 where the cathode wiring 35 is formed, because the opening of the second pixel separation film BM2 is formed so as to include the cathode wiring 35, the hole injection layer HTL is contacted with the cathode 34c as in a circle α of a broken line shown in FIG. 5C. Thus, current is leaked from this contacted area.

However, the leakage path through which this leakage current is carried has the same length in all the pixel circuits 101. Therefore, because the leakage current carried through the leakage path is almost the same in all the pixel circuits, no variations occur in the drive current carried through the organic film 34b for each pixel circuit. In other words, even though the leakage current occurs in the area where the cathode wiring 35 is formed, a color shift does not occur, and eventually display quality will not be degraded.

In addition, because the opening of the second pixel separation film BM2 is formed in a reverse tapered shape, the pixel circuit 101 can be completely isolated from the other pixel circuits, that is, from upper, lower, right and left pixel circuits adjacent to the pixel circuit 101. Thus, the pixel circuit 101 can be avoided from the influence of the other pixel circuits.

In addition, when the second pixel separation film BM2 is formed such that the organic film 34b, the cathode 34c, or the hole injection layer HTL is not vapor deposited on the side surface of the opening, a color shift caused by the leakage current through the hole injection layer HTL can be prevented as well as the influence of the other circuits can be avoided. In other words, the shape of the opening of the second pixel separation film BM2 is not limited to a reverse tapered shape, and it is sufficient that the second pixel separation film BM2 is formed such that the second pixel separation film BM2 does not gradually become wider as apart from the surface contacted with the first pixel separation film BM1, at least like a tapered shape. For example, the side surface of the opening of the second pixel separation film BM2 may be formed in a step such that the opening has a surface nearly vertical to the surface of the second pixel separation film BM2 contacted with the first pixel separation film BM1.

Figure 6A:
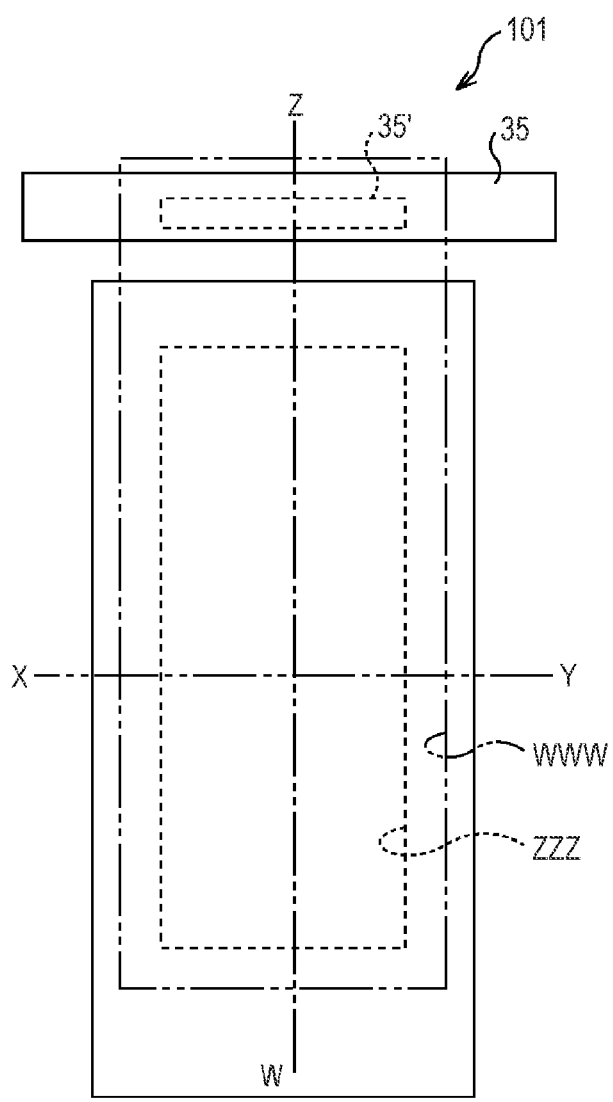
FIGS. 6A to 6C are diagrams depicting an exemplary configuration of another embodiment of a pixel circuit.
Figure 6C:
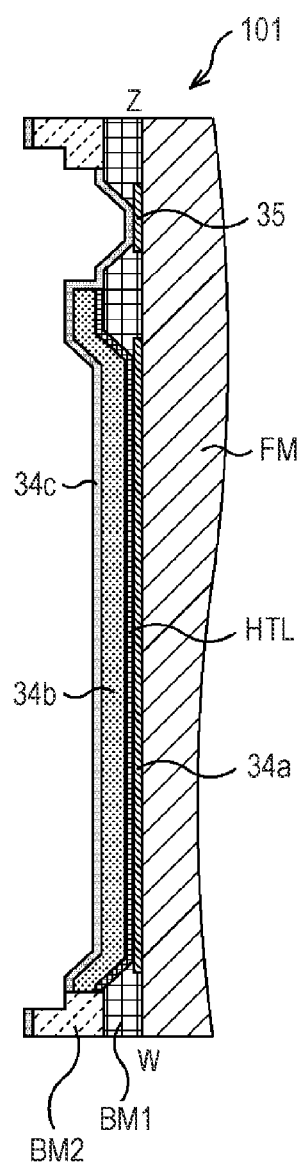
Figure 6B:
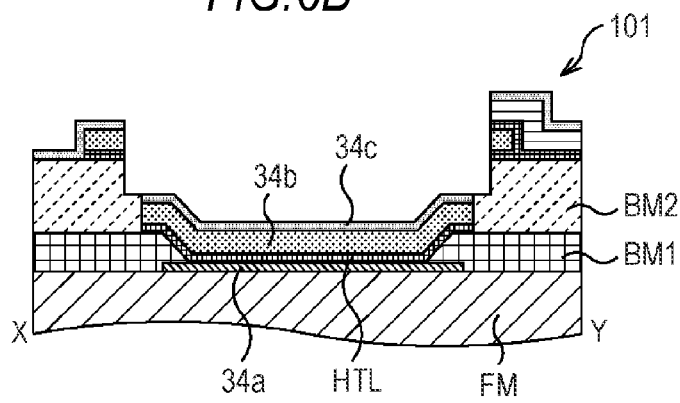

More specifically, FIGS. 6A to 6C are diagrams depicting another embodiment of the pixel circuit 101.

In a pixel circuit 101 shown in FIGS. 6A to 6C, an opening of a second pixel separation film BM2 is formed in a step with a single step. The opening of the second pixel separation film BM2 is formed in this manner, whereby the organic film 34b, the cathode 34c, or the hole injection layer HTL can be prevented from being vapor deposited on the side surface of the opening. Therefore, as similar to the pixel circuit 101 shown in FIG. 5A to 5C, a color shift can be prevented as well as the influence of the other circuits can be avoided.

In addition, the opening of the second pixel separation film BM2 is formed in a reverse tapered shape as the pixel circuit 101 shown in FIG. 5A to 5C, whereby the advantages described above can be obtained more reliably. In addition, the leakage current is reduced to suppress power consumption as well.

Here, for example, by utilizing a fabrication method using a mask different from the mask for the organic film 34b when the hole injection layer HTL is deposited, the leakage current through the hole injection layer HTL can be reduced with no dependence on the deposition order. However, in such a fabrication method, the number of masks for use is increased to prolong production time per unit component.

In contrast to this, in the pixel circuit 101 to which the invention is adapted, the leakage current can be reduced because of the shape of the opening of the second pixel separation film BM2 even though the same mask is used to deposit the hole injection layer HTL and the organic film 34b. Thus, production time per unit component is not prolonged.

In addition, Patent Document 1 described above discloses the organic EL display device that can separate pixels from each other. However, the organic EL display device can be adapted only to passive matrix-type panels. In addition, because only pixels laterally adjacent to each other can be separated, a pixel is affected by the pixels vertically adjacent to that pixel.

In contrast to this, the organic EL display device 100 to which the invention is adapted can be also adapted to active matrix-type panels as well as a pixel can be isolated from the other pixels laterally and vertically adjacent to that pixel.

Figure 7:
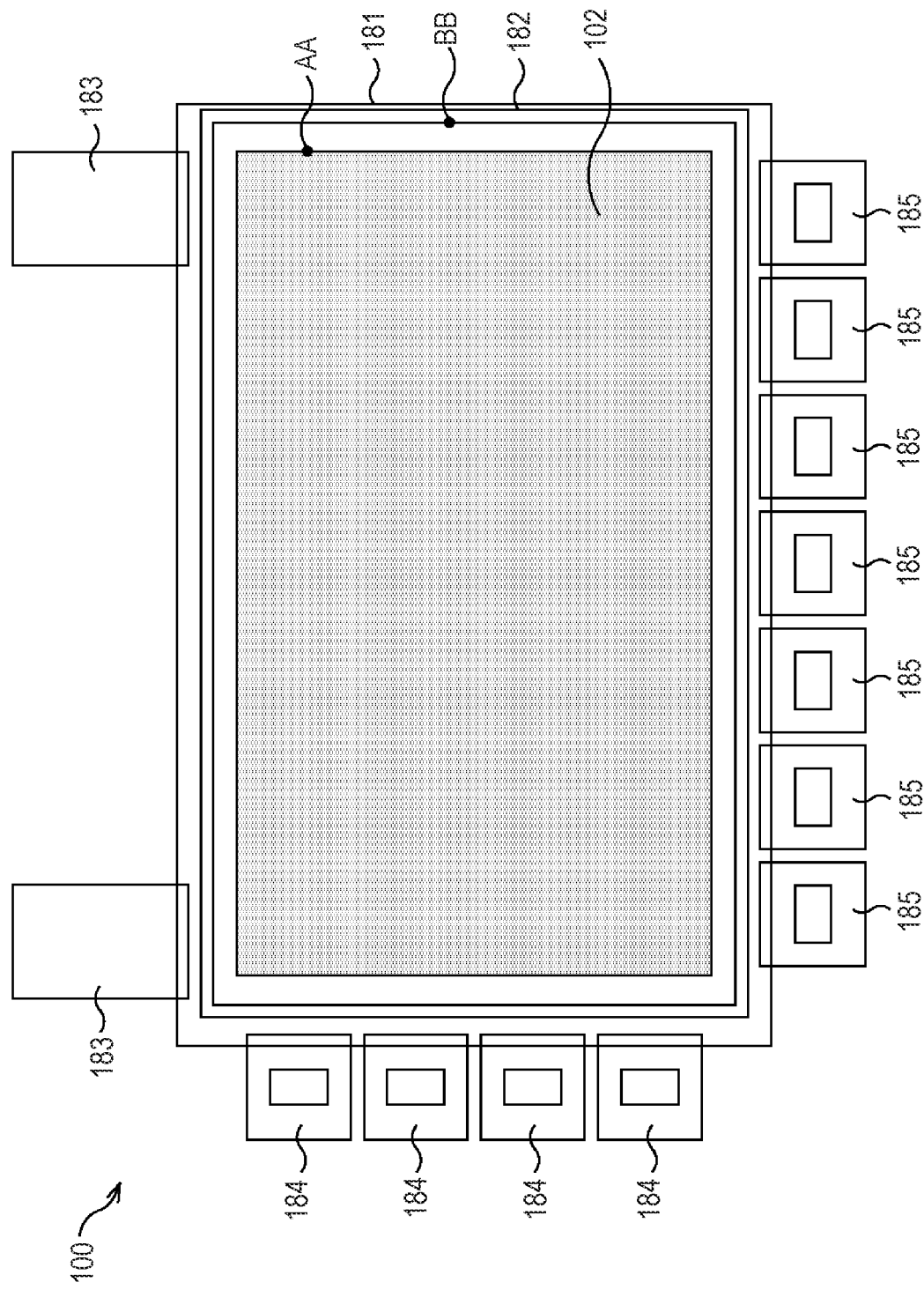
FIG. 7 is an exemplary layout of the substrate of an organic EL display device 100.

In addition, FIG. 7 is an exemplary layout of a substrate of the organic EL display device 100 shown in FIG. 2.

In a substrate 181 shown in FIG. 7, the pixel array unit 102 is arranged in the center. On the left side of the pixel array unit 102 in the drawing, scan signal supply TABs (tape-automated bonding) 184 having the function of the write scanner 104 are arranged. On the lower side of the pixel array unit 102 in the drawing, image signal supply TABs 185 having the function of the horizontal selector 103 are arranged. On the upper side of the pixel array unit 102 in the drawing, power supply TCPs (tape carrier package) 183 having the function of the power supply scanner 105 are arranged.

The area surrounded by a frame AA on the substrate 181 is the pixel array unit 102. The cathode 34c is formed in the area surrounded by a frame BB on the substrate 181, the frame BB about one to two millimeters larger than the frame AA, both top and bottom, left and right. After the organic film 34b and the cathode 34c are formed, an encapsulation material, not shown, is coated on the substrate 181, and then a counter glass 182 is mounted.

In addition, the embodiment of the invention is not limited to the embodiments described above, which may be variously modified within the scope of the teachings of the invention.

The present application contains subject matter related to that disclosed in Japanese Priority Patent Application JP 2008-206621 filed in the Japan Patent Office on Aug. 11, 2008, the entire contents of which is hereby incorporated by reference.

What is claimed is:

1. A display device comprising:
   a light emitting layer configured to emit light in accordance with current applied thereto;
   a first pixel separation film configured to define a first opening for providing a light emitting region through which the light emitting layer emits light; and
   a second pixel separation film laminated on the first pixel separation film and configured to define a second opening through which the light is emitted,
   wherein,
      the second pixel separation film includes oppositely facing first and second surfaces and a side surface extending between the first and second surfaces,
      the first surface of the second pixel separation film is in contact with the first pixel separation film,
      the side surface of the second pixel separation film is in contact with the light emitting layer,
      the second opening of the second pixel separation film is wider than the first opening, and
      the second opening of the second pixel separation film is wider at the first surface contacted with the first pixel separation film than at the second surface.

2. The display device according to claim 1, wherein the side surface of the second pixel separation film has a surface nearly perpendicular to the first surface of the second pixel separation film contacted with the first pixel separation film.

3. The display device according to claim 1, further comprising:
   a cathode film laminated on the light emitting layer and on the second pixel separation film, wherein the cathode film is separated between the inner side and the outer side of the second opening.

4. The display device according to claim 3, further comprising:
   a planarized film deposited on a predetermined substrate;
   an anode film laminated on the planarized film; and
   a cathode auxiliary wiring laminated on the planarized film,
   wherein,
      the first opening of the first pixel separation film provides the light emitting region by providing a connecting surface to connect the light emitting layer to the anode film,
      the first pixel separation film defines a third opening that provides a cathode contact to connect the cathode film to the cathode auxiliary wiring, and
      the size of the second opening of the second pixel separation film is the size including the first opening of the first pixel separation film and the third opening.

5. The display device according to claim 1, wherein the light emitting layer at least partially extends into the first and second openings.

6. The display device according to claim 5, wherein the light emitting layer at least partially extends onto the first pixel separation film.

7. The display device according to claim 1, further comprising:
   a cathode film laminated on the light emitting layer;
   a planarized film deposited on a substrate; and
   an anode film laminated on the planarized film,
   wherein,
      the cathode and anode films are spaced from each other along the first and second pixel separation films.

* * * * *